United States Patent
Tanzawa et al.

[11] Patent Number: 5,864,504
[45] Date of Patent: Jan. 26, 1999

[54] NONVOLATILE SEMICONDUCTOR MEMORY WITH TEMPERATURE COMPENSATION FOR READ/VERIFY REFERENCING SCHEME

[75] Inventors: Toru Tanzawa; Tomoharu Tanaka, both of Kanagawa-ken; Ken Takeuchi, Tokyo, all of Japan

[73] Assignee: Kabushiki Kaisha Toshiba, Kawasaki, Japan

[21] Appl. No.: 747,761

[22] Filed: Nov. 13, 1996

[30] Foreign Application Priority Data

Nov. 17, 1995 [JP] Japan ................................ 7-299940

[51] Int. Cl.⁶ .................................................. G11C 16/04
[52] U.S. Cl. ............................. 365/185.24; 365/185.2; 365/185.22; 365/212
[58] Field of Search ..................... 365/185.24, 185.22, 365/185.2, 212; 327/512, 513

[56] References Cited

U.S. PATENT DOCUMENTS

| | | | |
|---|---|---|---|
| 5,285,418 | 2/1994 | Yamaguchi | 365/212 |
| 5,434,533 | 7/1995 | Furutani | 327/513 |
| 5,440,520 | 8/1995 | Schutz | 365/226 |
| 5,619,122 | 4/1997 | Kearney et al. | 327/513 |
| 5,659,264 | 8/1997 | Ariyoshi et al. | 327/513 |

FOREIGN PATENT DOCUMENTS 55-13599  10/1980  Japan.

OTHER PUBLICATIONS

M. Bauer, et al. "A Multilevel–Cell 32Mb Flash Memory", ISSCC Digest of Technical Papers, (pp. 132–133), Feb., 1995.

*Primary Examiner*—Son T. Dinh
*Attorney, Agent, or Firm*—Oblon, Spivak, McClelland, Maier & Neustadt, P.C.

[57] ABSTRACT

An electrically erasable programmable read only memory (EEPROM) capable of reducing the margin of threshold voltage is disclosed which contributes to the achievement of low-voltage driving and/or multiple-value data storage architectures. The EEPROM includes an array of memory cells that are changeable in threshold voltage for data storage of different logic levels, wherein data may be read out of any specified one of the memory cells. A read voltage applied to the memory cell is designed to have a temperature dependence substantially identical to that of the memory-cell threshold voltage. A write-verify voltage may also be designed to have the same temperature dependence as that of the memory cell. Thus, the inter-threshold margin and the read margins of the memory cell can be reduced.

23 Claims, 4 Drawing Sheets

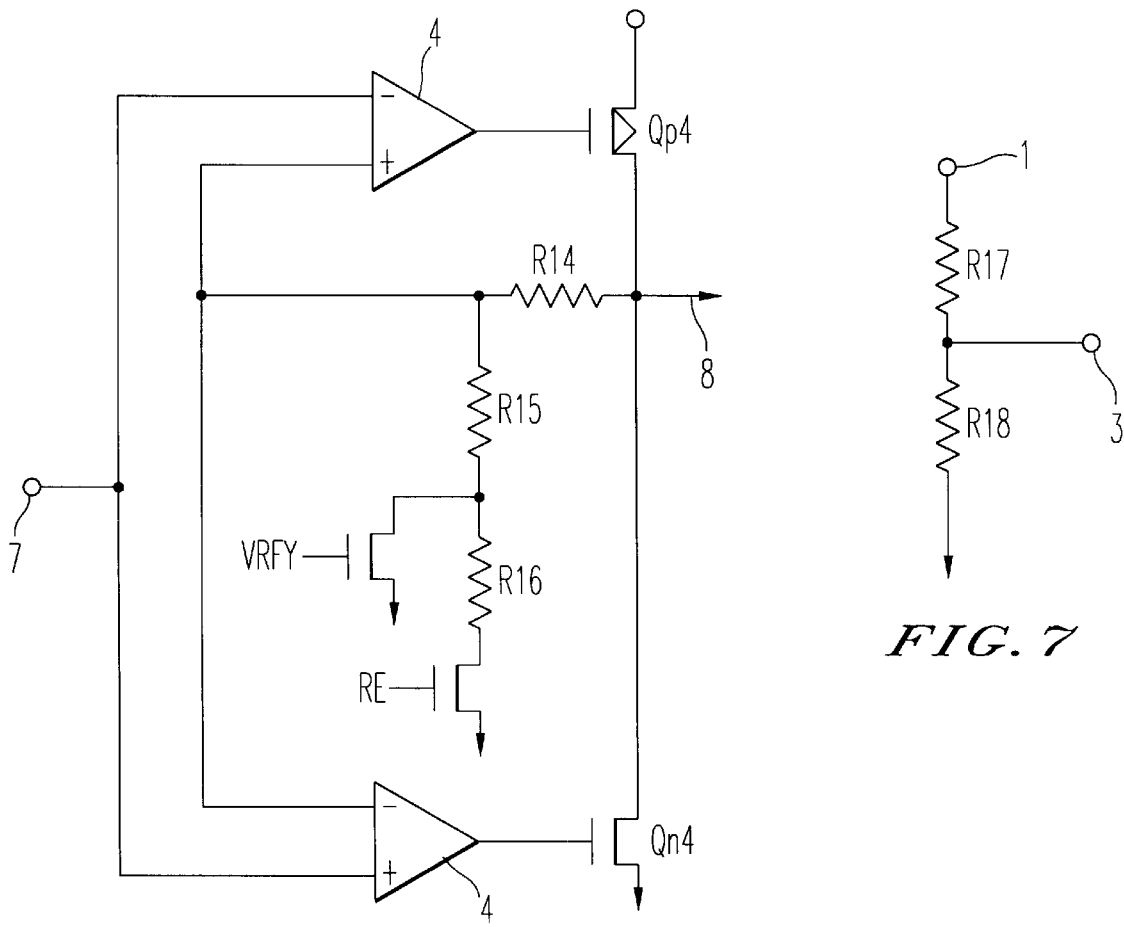
FIG. 6
FIG. 7
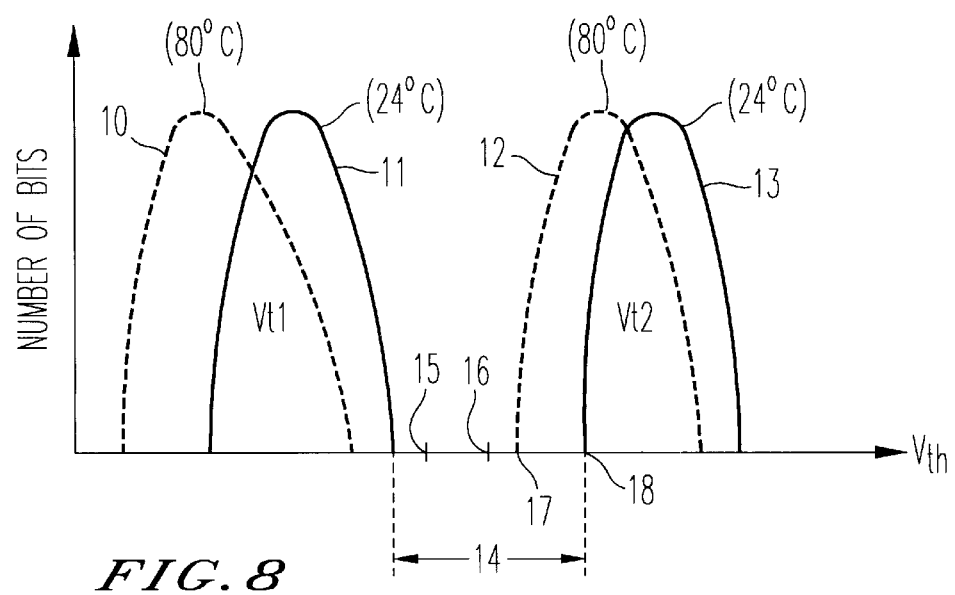
FIG. 8

NONVOLATILE SEMICONDUCTOR MEMORY WITH TEMPERATURE COMPENSATION FOR READ/VERIFY REFERENCING SCHEME

BACKGROUND OF THE INVENTION

1. Field of the Invention

The present invention relates generally to nonvolatile semiconductor memory devices, and more particularly to electrically programmable read-only memories of the type in which a read voltage or a verify voltage is essentially equivalent in temperature dependency characteristic to threshold voltages of memory cells therein.

2. Description of the Background

Nonvolatile semiconductor memory devices are becoming more widely used in the manufacture of digital equipment, particularly computers, as the speed and cost advantages of such devices increase. As the memories require higher packing density, higher speed, and lower power dissipation, reliability becomes more critical.

Nonvolatile memories include read-only memories (ROMs). Prior known ROMs are designed to employ two different kinds of threshold voltages Vt1, Vt2 for memory-cell transistors causing them to correspond to a "1" and a "0" for binary data being stored therein. In this case, the threshold voltage Vt of a memory cell may be represented by $$Vt = Vfb + X\{2\phi \times Fn \times (2\phi - Vbs) + g \times Fs(2\phi - Vbs)\}^{1/2},$$

where Vfb is the flat-band voltage (this is proportional to the difference "ϕ−ms" in work function between the gate and the silicon substrate used in the memory cell), X is the polarity of channel ("+1" when the channel is of the n conductivity type; "−1" when p type), ϕ is the Fermi potential, Fn is the correction coefficient for the "narrow channel" effect, Vbs is the potential difference between the substrate and the source, g is the back-bias effect coefficient, and Fs is the short-channel effect correction coefficient. Normally, the threshold voltage may be changed or switched between the two different potentials by changing the value of ϕ−ms due to alteration of the dose of channel implantation.

During read operations, the gate potential Vg of a memory cell is set at a certain level midway between the two threshold voltages (Vt1<Vt2). Assume that a memory cell having the threshold voltage Vt1 is selected for read. In this case, a corresponding cell transistor is rendered conductive causing a drain current to flow therein. Assuming on the other hand that a memory cell with the threshold voltage Vt2 is selected for read, its cell transistor is rendered nonconductive hindering the flow of drain current. Accordingly, data may be read by sensing whether such drain current attempts to flow in such selected cell.

Generally, as temperature varies, the gate-to-substrate work function difference ϕ−ms and Fermi potential ϕ will vary with the result of the memory-cell threshold value being also changed in potential accordingly. In contrast, the gate potential applied for read operations will not vary with temperature because of the fact that the gate potential is a power supply voltage or a voltage divided therefrom. Hence, any indeterminate data will no longer be read erroneously even when the threshold voltage varies due to temperature variations; consequently, it has been required that the two kinds of threshold voltages be established with a sufficient difference being predefined therebetween. In other words, a greater margin should be strictly required for the threshold values of cells.

Unfortunately, such "greater threshold value margin" approach does not come without accompanying a serious problem, especially on occasions where the power supply voltage accidentally drops in potential or in the case where an attempt is made to increase the magnitude of information per unit cell by letting a memory cell exhibit more than three kinds of threshold voltages.

FIG. 7 shows one prior known read voltage generator circuit, which is a voltage divider circuitry including two resistors R17, R18 for resistive division of an input voltage. FIG. 8 depicts a graphic representation for explanation of the threshold voltage margin, wherein solid lines are used to designate the distribution of threshold voltages at room temperature, and dotted lines indicate the same at high temperatures. As can be readily seen from viewing the graph, the threshold value tends to decrease in potential as the temperature increases. Due to this, even if the read margin has been optimized at room temperature, when the temperature increases, the resulting minimum value of higher threshold voltage Vt2 decreases to "escape" from the margin region; this results in that the actual read margin becomes smaller than the inherently expected margin.

Electrically rewritable nonvolatile semiconductor memories such as electrically erasable programmable read only memories (EEPROMs) are known. The EEPROMs have an array of memory cells fabricated on a silicon substrate, each of which employs a metal oxide semiconductor field effect transistor (MOSFET), i.e., an MOS structure with an electrically isolated gate commonly referred to as the floating gate for storage of electrical carriers, and a control gate overlying the charge storage gate. Typically, with such EEPROMs, data-writing or "programming" is carried out by application of a specific potential higher than the power supply voltage to a presently selected one of the memory cells during write operations thus controlling the charge amount on the charge storage layer (i.e., floating gate) by use of a variety of mechanisms such as avalanche injection, channel injection, tunneling, etc., depending on the construction of the cells. The selected cell will change in threshold value due to the resulting charge amount on its charge storage layer; accordingly, the cell can be selectively at one of the two threshold voltages (Vt1<Vt2). During erase operations, all the data are set at one threshold voltage (Vt1, by way of example) with a predefined bit length as a unit. Write or program operations are made selectively with respect to every bit: the threshold voltage of a selected cell is forced to be at Vt2, whereas those of the remaining, nonselected ones are kept at Vt1.

In the MOS-EEPROMs it is also required that memory cells being erased or ones programmed be substantially uniform in threshold value among cells. To attain this, the "verify read" operations are inevitable to verify that the programming and erasing operations have been performed properly with respect to either a cell bit or a block of cells concerned, while the programming is done for every bit, the erasing of the entire array or a block of individual memory cells may be accomplished. In this situation, during write-verify operations for example, a voltage Vvrfy higher than the ordinary read voltage Vread is specifically applied to the gate of a selected cell transistor to ensure that a sufficiently wide margin remains between the two kinds of threshold voltages therein.

Also in the MOS-EEPROMs, the memory-cell threshold voltage varies in potential with temperature as in the case of ROMs discussed previously; however, the read voltage and verify voltage are substantially independent of any possible temperature variations. In view of this fact, it has been strictly required that the two kinds of threshold values be so set as to allow a sufficient difference to remain therebetween. Especially in EEPROMS, such threshold-voltage margin should be much greater than that in ROMs. One reason for this is that it will possibly happen that the temperature decreases during application of the verify voltage Vvrfy, for instance, and increases during application of the ordinary read voltage Vread. In addition, this "wide threshold-voltage margin" scheme will raise a more serious problem on occasions where power supply happens to potentially drop accidentally as in ROMs, or in case where an attempt is made to increase the information storage amount per memory cell by letting cells exhibit more than three kinds of threshold voltage levels.

As has been discussed above, it is required that the prior art nonvolatile semiconductor memory devices, including ROMs and EEPROMs be greater in threshold-voltage margin to "absorb" any possible variations of cell transistors in threshold voltage with changes in ambient temperature, which in turn leads to a serious bar to achievement of low-voltage drive and multiple value data storage memory architectures.

SUMMARY OF THE INVENTION

It is therefore an object of the present invention to provide a new and improved nonvolatile semiconductor memory device.

It is another object of the invention to provide an improved nonvolatile semiconductor memory with a decreased threshold voltage margin.

It is a further object of the invention to provide an improved electrically programmable read only memory capable of reducing the margin of threshold voltage of memory cells thus contributing to accomplishment of low-voltage drive and/or multivalue data storage memory architectures.

To achieve the foregoing objects, the present invention provides a specific nonvolatile semiconductor memory device having an array of memory cells each being variable in threshold voltage depending upon the data storage state thereof, wherein data stored in a presently selected one of the memory cells is read by applying thereto a read voltage, featured in that the device a voltage, which remains substantially independent of temperature, is added to variations to a threshold voltage Vt of a memory cell potentially changeable with temperature variations to provide the read voltage.

In accordance with another aspect of the invention, there is provided an electrically rewritable nonvolatile semiconductor memory device having an array of memory cells each variable in threshold voltage depending on the data storage state, wherein a verify voltage is applied to verify that an intended data has been properly written or "programmed" into one or a plurality of presently selected memory cells. An adder unit may be included for adding a voltage, remaining substantially constant in potential while temperature varies, to a threshold voltage Vt of a memory cell potentially changeable with temperature variations to provide an appropriate voltage for verification of the program state of the memory cell(s).

The memory cells described above may be those constituting a read-only nonvolatile semiconductor memory device (ROM) or EEPROM.

Circuitry for generating a read voltage may include a MOS transistor having a gate and a drain commonly coupled together and coupled through an associated load resistor to a power supply terminal, and which is designed to receive at its source a voltage with no temperature dependency, wherein an output voltage at the drain is specifically taken out when the MOS transistor turns on.

Circuitry for generating the verify voltage may include a MOS transistor having its gate and drain commonly-coupled together and connected via an associated load resistor to a power supply terminal. The transistor receives at its source the voltage without any temperature dependency, wherein an output voltage appears at the drain.

Circuitry for producing the voltage having substantially no temperature dependency may alternatively be constituted from a resistor connected between a non-inverting input and an output of an operational amplifier, a diode inserted between the non-inverting input and ground, another resistor connected between an inverting input and the output of the operational amplifier, and a series circuit of a third resistor and a second diode inserted between the noninverting input and ground.

The circuitry for producing the voltage having substantially no temperature dependency may still alternatively incorporate a diode having a breakdown voltage of decreased temperature dependency, wherein a reference voltage is provided by the diode.

In accordance with a further aspect of the invention, a nonvolatile semiconductor memory device is provided which has an array of memory cells each being variable in threshold voltage depending upon a data storage state thereof, wherein data stored in a presently selected one of the memory cells is read by applying thereto a read voltage, featured by comprising, as a unit for generating the read voltage, a voltage generation circuit for providing a voltage variable in temperature dependency in compliance with temperature dependency of the threshold voltage of the memory cell, and a voltage conversion circuit for providing a necessary read voltage based on an output voltage of the constant voltage generation circuit. The voltage generation circuit sets the temperature dependency of the voltage so that the temperature dependency of the read voltage obtained by the voltage conversion circuit is identical to that of the threshold voltage of the memory cell.

A significant advantage of the invention is that it becomes possible, by use of a specific voltage substantially independent of any possible temperature variations, and the inherent memory-cell threshold voltage Vt with temperature dependency, to keep the resulting read voltage essentially equivalent in temperature dependency to the memory-cell threshold voltage. This can ensure that an erroneous data read will no longer take place even when the memory-cell threshold voltage potentially varies with temperature.

Another significant advantage of the invention is that, in addition to the preceding advantage regarding the "temperature dependency equalization" feature, it is possible to provide a read voltage having substantially the same temperature dependency as that of the memory-cell threshold voltage. This comes from an optimization of parameters of a voltage generator circuit which cooperates with a voltage converter circuit operatively coupled therewith.

It has been described that an adder unit is employed for adding a voltage with substantially no temperature dependency to the threshold voltage of an intended memory cell with temperature dependency so that a read voltage or a verify voltage remains substantially identical in temperature dependency to the memory-cell threshold voltage, which may in turn lower the threshold voltage margin. This will much contribute to obtaining highly advanced low-voltage driving and multivalue data storage architectures.

These and other objects, features and advantages of the invention will be apparent from the following more particular description of preferred embodiments of the invention, as illustrated in the accompanying drawings.

BRIEF DESCRIPTION OF THE DRAWINGS

FIG. 6 shows circuitry for providing a read voltage corresponding in potential to a substantially temperature-independent voltage.

FIG. 7 shows one prior art read voltage generator circuit.

FIGS. 8 and 9 are graphic representations for explanation of the threshold voltage margin according to the invention and to the prior art, respectively.

DETAILED DESCRIPTION OF THE INVENTION

A circuit for generating a temperature-compensated read voltage and that for verify voltage in a nonvolatile semiconductor memory including a read-only memory (ROM) and an electrically erasable and programmable read-only memory (EEPROM) are disclosed. In the following description specific details are set forth such as a specific device types, voltages, etc., in order to provide a thorough understanding of the present invention. It will be obvious, however, to one skilled in the semiconductor art that the invention may be practiced without these specific details. In other instances, well-known processes and circuits have not been described in detail to avoid unnecessarily obscuring the present invention.

Figure 1:
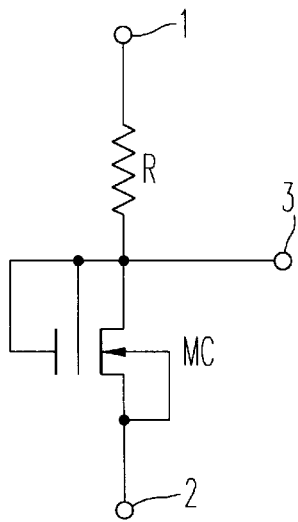
FIG. 1 is a circuit diagram showing a temperature-compensated read voltage generator circuit in accordance with one preferred embodiment of the invention.

Referring to FIG. 1, a temperature-compensated read voltage generator circuit for use in a nonvolatile semiconductor memory in accordance with one preferred embodiment of the invention is shown. This read voltage generator includes a metal oxide semiconductor field effect transistor (MOSFET) MC that is identical in structure and fabrication process to those in an array of memory cells of a ROM or an EEPROM, and a high resistivity resistor R operatively coupled therewith. MOSFET MC has a gate acting as a carrier storage layer and an overlying control gate, which are coupled to a drain thereof and also connected via resistor R to a power supply terminal 1. Transistor MC has a source connected to an input terminal 2 for receiving a substantially constant voltage having a low temperature dependency characteristic, and hence substantially independent of temperature variations. The drain of transistor MC is coupled to an output terminal 3 causing an output voltage appearing at terminal 3 to be used as a read voltage.

The output voltage Vo at the output terminal 3 of the read voltage generator may be given as $$Vo = Vsc + Vt,$$

where Vt is the threshold voltage of transistor MC and Vsc is the voltage at terminal 2. Consider that when the temperature varies, the degree of variation of transistor threshold voltage Vt is dVt whereas that of the output voltage, i.e., the variation of the gate voltage of a memory cell transistor, is dVo. Assuming that the temperature variation of Vsc is negligible, we have then $$dVo = dVt.$$

This indicates that the read voltage is identical in temperature variation to that of the threshold voltage.

Accordingly, in the embodiment, since the temperature variation amount of the read voltage adaptable for use in reading data as stored in a selected memory cell can remain identical or "equalized" to that of the threshold voltage of the memory cell, it is no longer necessary to provide a greater potential margin between adjacent ones of threshold potential levels enabling easy accomplishment of low-voltage operations and/or multivalue memory schemes.

This advantage is shown by FIG. 8. FIG. 8 illustrates the Vt distribution for logic "0" and "1" levels at high (for example, 80° C.) and low (for example, 24° C.) temperatures. Curves 10 and 11 correspond to "0" at high and low temperatures, respectively, and curves 12 and 13 correspond to "1" at high and low temperatures, respectively. The verify voltage (Vvrfy) is the minimum point of the "1" distribution, and the difference between this point and the highest point of the "0" distribution is the inter-Vt margin voltage, and is indicated as 14. Reference numerals 15 and 16 indicate the voltages approximately at which the read operation is performed at high and low temperatures, respectively. The read margin at high temperature is the difference between point 15 and the highest point of curve 10, and the read margin at low temperature is the difference between point 16 and the highest point of curve 11. Since the read voltage varies with temperature in the same manner as Vt, the read margins remain the same.

Reference numerals 17 and 18 indicate the verify voltage at high and low temperatures, respectively. Since the verify voltage also varies with temperature in the same manner as Vt, the verify operation can be accurately achieved.

Figure 9:
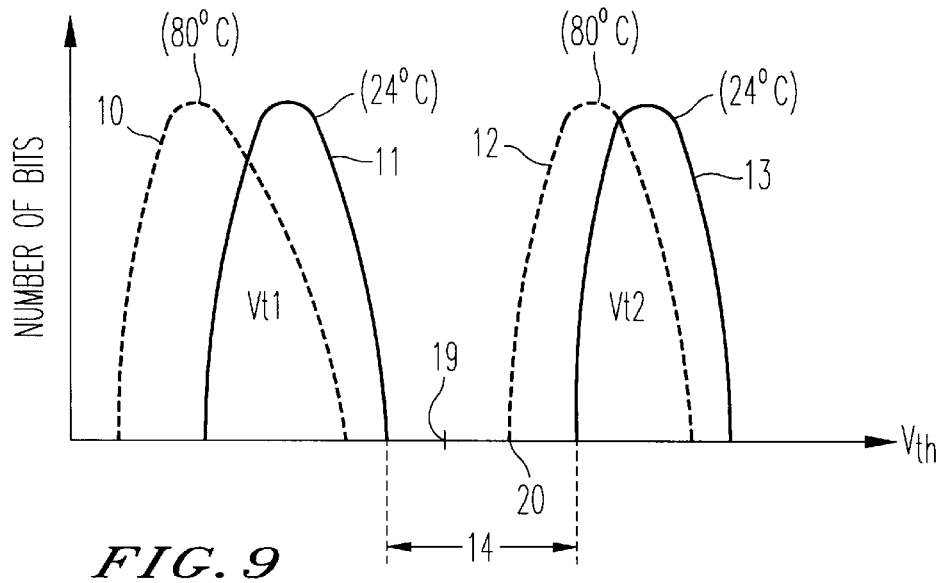

FIG. 9 illustrates the prior art when the read voltage does not vary with the change in Vt. In this case, a single read voltage is used, indicated as 19, chosen as approximately equidistant from the highest point of curve 11 and the power point of curve 12. When reading is done at high temperatures and programming is done at low temperatures, the margin between the "1" distribution and the read voltage is decreased by dVt, and when the reading is done at low temperatures and programming is done at high temperatures, the margin between the "0" distribution and the read voltage is likewise decreased by dVt. In order to obtain the same read margins as are possible according to the invention, the inter-Vt margin, the difference between corresponding high and low temperature curves, must be increased by 2 dVt. As described above, this restricts the use of multivalue memory schemes, especially as the operating voltage decreases.

A single verify voltage, indicated as 20, is also used. When the temperature decreases, the verify voltage no longer coincides with the Vt curve.

Figure 10:
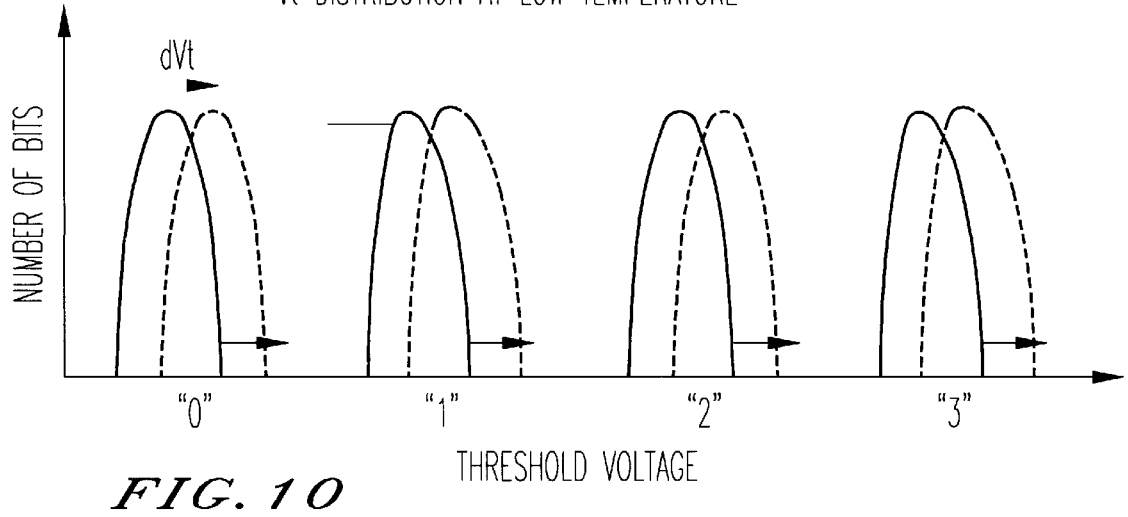
FIG. 10 is a diagram of a multivalue memory cell threshold voltage distribution.

An example of a multivalue memory cell is shown in FIG. 10. Here, the cell has 4 levels. As described above, in the memory cell according to the invention, the inter-Vt margin can be reduced by 2 dVt for a two-level cell, compared to the prior art. For the 4-level cell the threshold distribution can be reduced by 6 dVt because there are 3 inter-Vt levels in the 4-level cell. In nonvolatile inventions, the threshold voltages of a memory in the "0" distribution often increases due to repeated read operations, and the threshold of the "3" distribution often decreases during aging, which may give rise to data errors. The frequency of such errors depends on the voltage difference between the "0" and "3" threshold voltage distributions. The larger the difference, the greater the frequency. In the present invention, where the inter-Vt margins can be decreased by (N−1)×dVt for an N-level cell, a more reliable multi-value memory cell can be achieved by reduction in the error frequency.

The following discussion is directed to the two-value memory cell for convenience only and does not limit the invention. It is equally applicable to multivalue cells.

Figure 2:
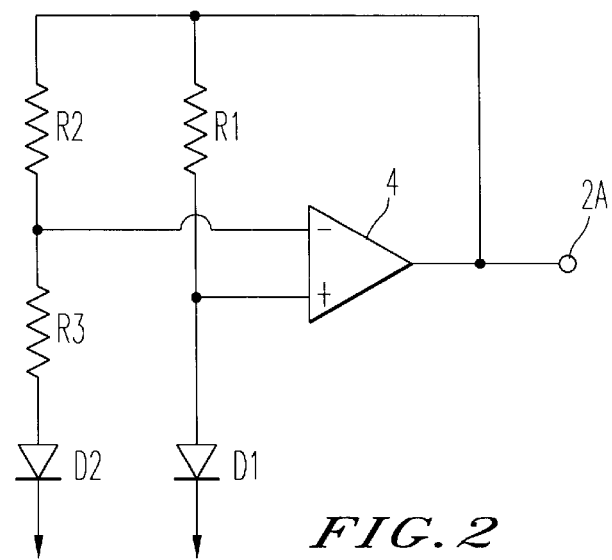
FIGS. 2 and 3 illustrate exemplary configurations of circuitry for generating a voltage that remains smaller in temperature dependency.

A band-gap referencing circuit shown in FIG. 2 generates an output voltage at terminal 2A having a low, or substantially no temperature dependency. This circuit includes an operational amplifier 4 having an inverting input, a noninverting input and an output with a resistor R1 being coupled between the noninverting input and output of amplifier 4. A diode D1 is coupled between the noninverting input and ground, while a series combination of resistor R3 and diode D2 is connected between the inverting input of amplifier 4 and ground. The output 2A of amplifier 4 is connected to input terminal 2 of the read voltage generator circuit shown in FIG. 1.

The illustrative circuitry per se is known under the name of band-gap referencing circuit as has been disclosed, for example, in P. R. Gray and R. G. Maier, "Analog Integrated Circuit Design Technology (Vol. 1)," BaifuKan Press., pp. 275–276. With the circuitry the output voltage thereof, Vbgr, may remain substantially constant in potential even when the ambient temperature varies, as demonstrated by equations that follow:

$$Vbgr=Vf1+\alpha V_T,$$

$$V_T=kT/q,$$

where Vf1 is the forward bias of diode D1, is a constant which may be determined depending upon the resistance ratio "R2/R1" or "R2/R3" alike, k is the Boltzmann's constant, T is the absolute temperature, and q is the elementary electric charge. The voltage Vf1 varies oppositely with temperature compared to the voltage $V_T$, and is chosen to maintain Vbgr substantially constant.

Figure 3:
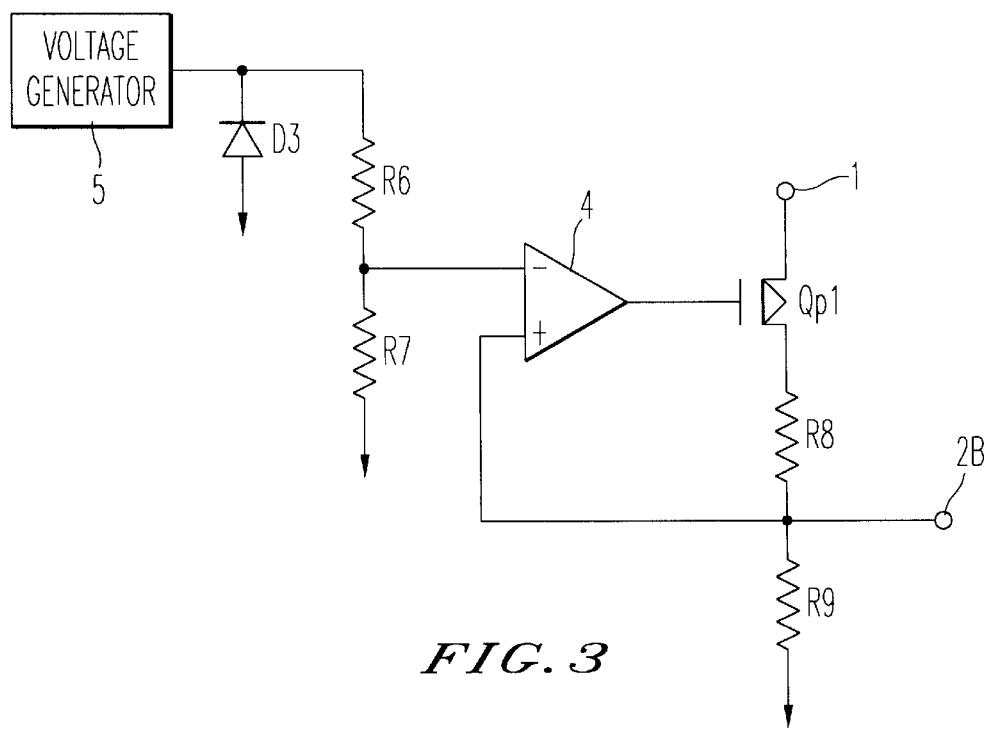

A circuit shown in FIG. 3 may also be adaptable for use in generating an output voltage at terminal 2B having a low, or substantially no, temperature-dependency, which employs a diode D3 with a breakdown voltage having a low temperature dependency and thus is substantially independent of temperature variations. A voltage generator circuit 5 is connected to four resistors R6–R9 and a P-channel MOSFET (PMOSFET) Qp1. This circuitry also has been described in the above-indicated publication "Analog Integrated Circuit Design Technology" at pp. 270–272, wherein the output voltage may remain substantially constant in potential where the temperature varies as demonstrated by the above equations.

Figure 4:
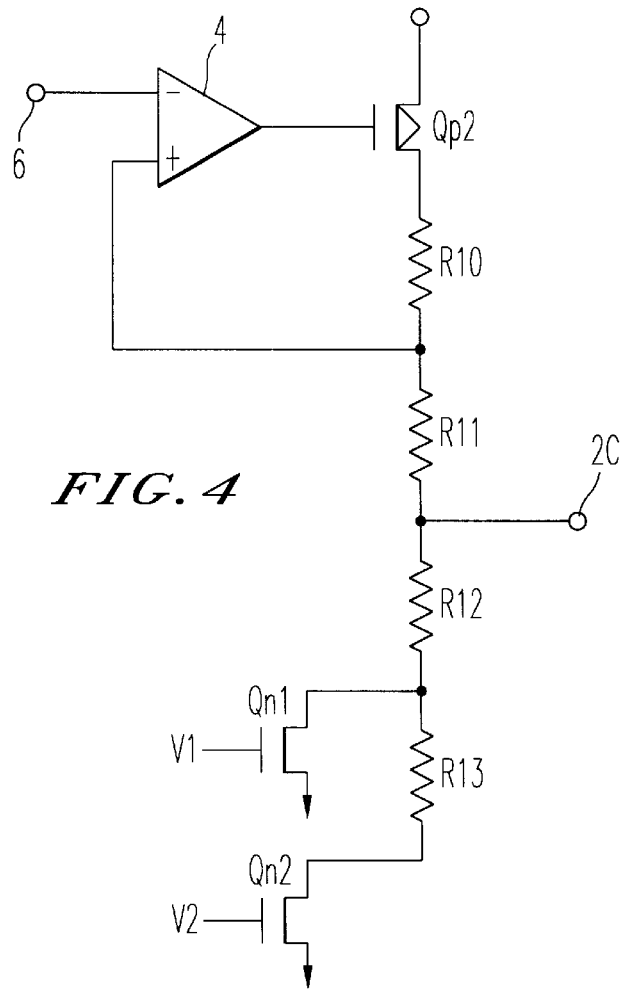
FIG. 4 depicts a configuration of circuitry capable of generating at its output a plurality of temperature-compensated read voltage levels.

Another circuit, shown in FIG. 4, is a modification of the FIG. 3 circuit, and is capable of generating at its output a plurality of temperature-compensated read voltages. This circuit includes a PMOSFET Qp2 having a drain coupled to power supply, and a gate connected to the output of an associated operational amplifier 4. The drain of PMOSFET Qp2 is connected through a resistive element R10 to the noninverting input of operational amplifier 4. Amplifier 4 receives at its inverting input from terminal 6 a substantially constant voltage. This voltage may be generated, for example, by the circuits shown in FIGS. 2 or 3. A series combination of resistors R11, R12, R13 is connected to the noninverting input of amplifier 4, and the common node of resistors R11, R12 is connected to the output 2C. Output 2C may be fed to input 2 of the read voltage generator shown in FIG. 1. Resistors R12, R13 define a node coupled to ground through an N-channel MOSFET (NMOSFET) Qn1, while resistor R13 is coupled to ground via another NMOSFET Qn2 as shown.

With such an arrangement, when a first input voltage V1 applied at the gate of NMOSFET Qn1 is at a logical high or "H," the output voltage Vo1 is represented by $$Vo1=R12/(R11+R12)\times V6,$$

where R11 to R13 are the resistance values of resistors R11–R13 respectively, and V6 is the voltage at terminal 6. On the other hand, when a second voltage V2 input to the gate of NMOSFET Qn2 is at "H," the resulting output voltage Vo2 is given as $$Vo2=(R12+R13)/(R11+R12+R13)\times V6.$$

Here, since Vo1<Vo2, an ordinary read voltage and a write-verify voltage can be identical in potential variation during temperature variations by specifically setting in value the write-verify voltage Vvrfy at (Vo2+Vt) while letting the read voltage Vread be (Vo1+Vt). This advantageously serves to eliminate the need of providing a wide margin between the neighboring threshold potential levels, thus enabling easy achievement of low-voltage operations and/or multivalue memory schemes.

A temperature-compensated read/verify generator circuit in accordance with another embodiment of the invention will now be described herein, which is designed to optimize respective factors or parameters of the circuit of FIG. 2 for providing the temperature-compensated read voltage and/or verify voltage. Consider here the case where the temperature dependency of memory-cell threshold voltage is −2 mV/ C, the read voltage is 1.0 V at room temperature $T_0$, and the verify voltage is 1.5 V.

Figure 5:
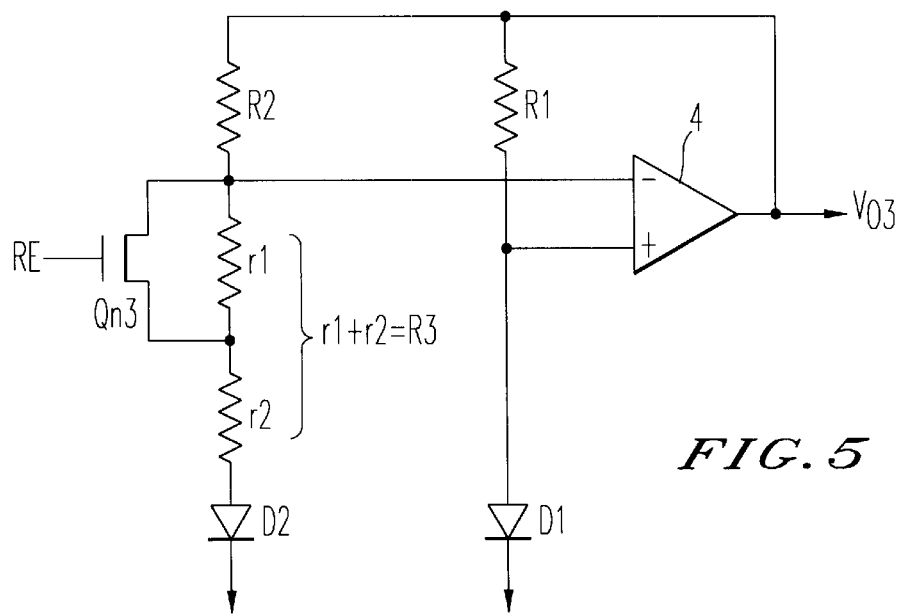
FIG. 5 illustrates a voltage generator circuit with a temperature coefficient determined by the read voltage.

As shown in FIG. 5, a circuit embodying the invention is similar to that of FIG. 2 in that it includes one operational amplifier 4, two diodes D1, D2 and three resistors R1–R3. A difference of the former from the latter circuit is that resistor R3 is subdivided into two resistive elements r1, r2 (where R3=r1+r2), and that an NMOSFET Qn3 is connected in parallel with resistor r2.

An output voltage Vo3 obtained here is represented as $$Vo3=Vf1+\alpha V_T,$$

and $$\alpha=R2/R3\ Ln\{(R2\times A2)/(R1\times A1)\},$$

$$V_T=kT/q,$$

where Vf1 is the forward bias voltage of diode D1; A1, A2 are the junction areas of diodes D1, D2, respectively; k is Boltzmann's constant; T is the absolute temperature; and q is the elementary electric charge. As demonstrated by the preceding equation, even if resistors R1–R3 exhibit some temperature dependency, the resultant ratio thereof no longer has any temperature dependency and may remain substantially independent of temperature variations.

Consequently, the temperature dependency of output voltage Vo3 is rendered changeable with the value of constant α.

Generally, in case where the read voltage and verify voltage are generated based on the resistor division scheme, the resulting temperature coefficient will also vary in compliance with the resistor division ratio used. As a consequence, it is required that the constant α be appropriately determined in value with respect to each voltage. When Vf1=0.6 V at room temperature $T_0$, if the temperature coefficient thereof is −2 mV/C, the output voltage Vo3 at temperature T is $$Vo3=(0.6-0.024\alpha)+8\times10^{-5}(\alpha-25)\,(T-T_0).$$

Assuming that a memory-cell gate voltage (such as the read voltage or verify voltage) Vcg is the voltage Vo3 multiplied by β, then we have $$Vcg=\beta Vo3.$$

At this time, where the gate voltage Vcg and output voltage Vo3 are $Vcg_0$, $Vo3_0$ at room temperature $T_0$, then it is required that the parameter α for $Vcg_0$=1.0 V, 1.5 V be selected in value in

TABLE 1

| $Vcg_0$ | α | $Vo3_0$ | β |
|---|---|---|---|
| 1.0 V | 6.3 | 0.75 V | 1.33 |
| 1.5 V | 8.3 | 0.86 V | 1.74 |

It is apparent from viewing Table 1 that each parameter α comes with a corresponding voltage $Vo3_0$ and coefficient β. Once the value of parameter α is given, a set of five different parameters, namely, resistance values of the three resistors and pn-junction areas of the two diodes, cannot be determined automatically. In this case, it may be recommendable that such values be set, for example, as follows: A1=A2, R1=25 k , R2=100 k, R3=22 k (for $Vcg_0$=1.0 V) or 29 k (for $Vcg_0$=1.5 V).

The circuitry shown in FIG. 5 provides two different kinds of output voltages. The circuit receives at the gate of Qn3 a read-enable signal RE that is at "H" level during read operations, and at "L" during verify operations. Note here that the above example, r1=7 k whereas r2=22 k.

A circuit shown in FIG. 6 is the one that receives the substantially constant voltage at input 7 (from, for example, the circuits of FIGS. 2 or 3) and generates at its output 8 voltages corresponding to the read and verify voltages. The circuit of FIG. 6 acts as a voltage converter circuit when, for example, R14=2.5 k , R15=4.4 k, R16=3.1 k, determined depending on the selected value of β as taught by Table 1. The illustrative circuit is connected to receive the signal RE, and a reference signal VRFY which is at "H" level when verify is effected. With such an arrangement, two different kinds of substantially constant memory-cell gate voltages Vcg can be obtained by a single circuit.

More specifically, while the circuit of FIG. 5 generates and issues a constant voltage Vo3 having a desired temperature dependency characteristic, the circuit of FIG. 5 produces a required read voltage based on the substantially constant voltage input thereto. Furthermore, with the circuit of FIG. 5, the temperature dependency characteristic of output substantially constant voltage is specifically determined to ensure that the read voltage is identical in temperature dependency characteristic to the memory-cell threshold voltage Vt.

In accordance with this embodiment, the substantially constant voltage generator and voltage converter cooperate to produce the read voltage while optimizing the parameters of constant voltage generator, thereby enabling production of a desired read voltage that is identical in temperature dependency to the threshold voltage Vt of memory cell(s). Accordingly, this embodiment offers substantially the same advantages as in the first embodiment discussed previously.

An exemplary temperature dependency characteristic in accordance with the principles of the present invention is shown in Table 2, which represents the threshold voltages (Vt) of all the NMOS transistors as employed in a nonvolatile semiconductor memory as follows.

TABLE 2

| Transistor | Vt (25° C.)−Vt (85° C.) |
|---|---|
| Vcc-NMOS (E type) | 0.11 V |
| Vpp-NMOS (E type) | 0.14 V |
| Vpp-NMOS (I type) | 0.02 V |
| Vpp-NMOS (D type) | 0.12 V |
| Memory Cells | 0.15 V |

In Table 2 the indication "Vcc-NMOS" is used to designate NMOS an transistors with a chip power-supply voltage Vcc being applied between the gate and drain of each one; "Vpp-NMOS (E, I or D type)" represents E, I or D type NMOSFETs with a potentially raised or "boosted" high voltage Vpp being applied between the gate and drain for rewrite or "reprogramming" of data, wherein the threshold voltage is changeable among three potential levels: positive, zero and negative levels. As seen from Table 2, the temperature dependency of cells may vary 0.15 V while the temperature varies in the range of 60 degrees.

Figure 11:
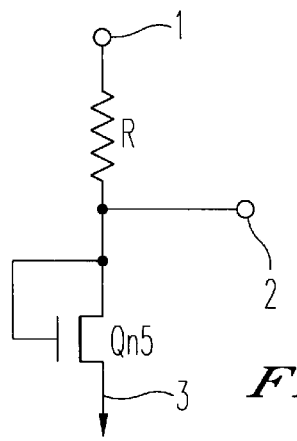
FIG. 11 is a temperature compensation circuit according to the invention.

FIG. 11 shows a temperature compensation circuit employing, an alternative of the cell, a Vpp/E-type NMOSFET Qn5 (Vt(25° C.)−Vt(85° C.)=0.14 V) which approximates the cell in temperature dependency characteristic most closely. Conventionally, owing to the fact that the threshold voltage of cells varies up to 0.30 V (=0.15 V×2) when the temperature varies from −35° to +85° C., which corresponds to the temperature compensation range of semiconductor memories, it has been strictly required that the margin of threshold-voltage distribution be increased by 0.30 V accordingly. By contrast, in the circuit of FIG. 11, even when the temperature variation of cell threshold voltage is as large as 0.30 V, the threshold voltage distribution margin can be allowed to increase by a mere net value of 0.02 V because of the fact that the read or verify voltage (Vread) varies by 0.28 V with such temperature variations. Since it is not necessary to provide an increased threshold-voltage distribution margin, the potential interval between the threshold voltages may be narrowed, achieving enhanced reliability of cells.

Although the invention has been particularly shown and described with reference to preferred embodiments thereof, it should be understood that various changes, substitutions, and alterations can be made therein without departing from the spirit and scope of the invention as defined by the appended claims. For instance, the memory cells should not be exclusively limited to those for use in ROMs or EEPROMs. Any type of memory cells may alternatively be employed insofar as they have a plurality of threshold potential levels. Likewise, the output voltage of the circuits according to the invention may also be applied, in addition to the foregoing read voltage and verify voltage, to any other parts or components which require a voltage identical in temperature dependency to that of memory-cell transistor threshold voltages.

What is claimed is:

1. A voltage generating circuit, comprising:
a substantially constant voltage source having an output; and
a circuit, connected to said output, having an element whose voltage characteristics vary with temperature and an output at which appears a voltage being a combination of said substantially constant voltage and said voltage characteristics;
wherein said voltage characteristics vary substantially in the same manner as a temperature variation of a threshold voltage characteristic of one of a memory cell and a transistor.

2. A circuit as recited in claim 1, wherein said voltage source comprises:
means for generating a first substantially constant voltage corresponding to a read voltage of said memory cell; and
means for generating a second substantially constant voltage corresponding to a verify voltage of said memory cell.

3. A circuit as recited in claim 2, wherein:
said memory cell contains at least three memory levels;
said means for generating a first substantially constant voltage generates a plurality of read voltages; and
said means for generating a second constant voltage generates a plurality of verify voltages.

4. A circuit as recited in claim 1, wherein said voltage source comprises:
a voltage generator;
a voltage divider circuit having an input connected to said voltage generator and an output connected to said circuit.

5. A circuit as recited in claim 1, wherein said voltage source comprises:
a voltage generator;
a voltage divider circuit having a plurality of resistors connected in series;
a switch circuit connected to said resistors to vary the voltage appearing at said output of said circuit among selected levels.

6. A circuit as recited in claim 5, wherein said switch circuit varies said voltage appearing at said output of said circuit between a read voltage and a verify voltage.

7. A circuit as recited in claim 1, wherein said transistor comprises an E-type NMOS device.

8. The circuit of claim 5, wherein said read only memory includes an electrically erasable and electrically programmable read only memory.

9. A device as recited in claim 1, comprising:
a power supply; and
said substantially constant voltage source circuit connected to said power supply.

10. A device as recited in claim 1, comprising:
wherein said one of a memory cell and a transistor are included in a second circuit designed to receive said voltage appearing at said output of said circuit.

11. A method of operating a memory cell, comprising:
generating at least one of a temperature-compensated read voltage and a temperature-compensated verify voltage; and
applying at least one of said read and verify voltages to said memory cell;
wherein generating at least one of said read and verify voltages comprises compensating at least one of said read and verify voltages based upon a threshold voltage temperature characteristic of said memory cell.

12. A method as recited in claim 11, wherein said generating step comprises:
generating a substantially constant voltage; and
combining said substantially constant voltage with a voltage having a temperature characteristic substantially the same as a temperature characteristic of said memory cell to produce a combined voltage;
applying said combined voltage to said memory cell as at least one of read and verify voltages.

13. A method as recited in claim 12, wherein:
generating said substantially constant voltage comprises generating first and second substantially constant voltages; and
combining said voltage comprises combining said voltage having said temperature characteristic with at least one of said first and second substantially constant voltages.

14. A method as recited in claim 11, comprising:
using a second memory cell to generate said at least one of said verify and read voltages.

15. A method as recited in claim 11, comprising:
generating at least one of said read voltage and said verify voltage to have a varying temperature characteristic substantially the same as a temperature characteristic of said memory cell.

16. A circuit for program state identification for use in a nonvolatile semiconductor memory device having an array of memory cells on a substrate, each of said cells having a transistor changeable in threshold potential to have one of several predefined threshold voltages during operations, said circuit comprising:
first circuit means for providing a voltage substantially independent of temperature variations; and
second circuit means coupled to said first circuit means and said array, for providing a combined voltage by potentially combining the constant voltage with a voltage indicative of the threshold voltage of one of said cells and variable in potential with temperature variations, and for applying the combined voltage to the one cell;
wherein said combined voltage of varies substantially in the same manner as a temperature variation of said threshold voltage characteristic of said one of said cells.

17. The circuit of claim 16, wherein said circuit includes at least one of a read circuit for reading data from one of said cells by use of said combined voltage as a read voltage, and a verify circuit for verifying the state of one of said cells using said combined voltage as a verify voltage.

18. The circuit of claim 16, wherein said second circuit means comprises:
a metal oxide semiconductor transistor substantially identical in threshold voltage temperature characteristic to said one cell; and
said second circuit means using an output voltage of said transistor as one of said read voltage and said verify voltage.

19. The circuit of claim 16, wherein said first circuit means comprises:
an operational amplifier having an inverting input, a noninverting input and an output;
a first resistive element coupled to the inverting input and the noninverting input of said amplifier;
a diode connected between said noninverting input and ground;

a second resistive element connected between the noninverting input and the output of said amplifier; and a series combination of a third resistive element and a second diode being connected between said inverting input and ground.

20. The circuit of claim 16, wherein said first circuit means comprises:

a diode having a breakdown voltage with a decreased temperature dependency; and voltage divider means coupled to said diode for potentially dividing an output voltage of said diode to provide one of a divided and weighted voltage at a predefined division ratio.

21. The circuit of claim 16, wherein said nonvolatile semiconductor memory device includes a read only memory.

22. A device as recited in claim 16, comprising:

a power supply; and said first circuit means being connected to said power supply.

23. In a nonvolatile semiconductor memory device having an array of memory cells each being changeable in threshold voltage depending upon a data storage state thereof, a circuit for reading one of said cells comprising:

read voltage generator means operatively coupled to said array for providing a read voltage to one of said cells;

said read voltage generator means including a constant voltage generation circuit for providing a constant voltage adjustable in temperature dependency with a temperature dependency of the threshold voltage of the one cell, and a voltage conversion circuit for providing the read voltage based on an output voltage of said constant voltage generation circuit; and said constant voltage generation circuit setting the temperature dependency of the constant voltage so that the read voltage is substantially identical in temperature dependency to the threshold voltage of said cell.

* * * * *